(12) United States Patent
Shimizu

(10) Patent No.: US 12,293,915 B2
(45) Date of Patent: May 6, 2025

(54) DIAMOND WAFER DIVIDING METHOD AND CHIP MANUFACTURING METHOD

(71) Applicant: DISCO CORPORATION, Tokyo (JP)

(72) Inventor: Yoshiaki Shimizu, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 429 days.

(21) Appl. No.: 17/821,347

(22) Filed: Aug. 22, 2022

(65) Prior Publication Data

US 2023/0071868 A1    Mar. 9, 2023

(30) Foreign Application Priority Data

Sep. 3, 2021    (JP) .................................. 2021-143683

(51) Int. Cl.
  *H01L 21/268*    (2006.01)
  *B23K 26/50*    (2014.01)
  *B23K 103/00*   (2006.01)

(52) U.S. Cl.
  CPC ............ *H01L 21/268* (2013.01); *B23K 26/50* (2015.10); *B23K 2103/56* (2018.08)

(58) Field of Classification Search
  CPC . H01L 21/268; H01L 21/67115; H01L 21/78; H01L 21/8206; B23K 26/05; B23K 26/53; B23K 2103/56
  See application file for complete search history.

(56) References Cited

U.S. PATENT DOCUMENTS

2016/0270151 A1*   9/2016   Morikazu ......... H01L 21/67092
2020/0105543 A1*   4/2020   Nomoto ................ H01L 21/428

FOREIGN PATENT DOCUMENTS

JP          03198363 A      8/1991
JP         2002192370 A     7/2002

\* cited by examiner

*Primary Examiner* — Brook Kebede
(74) *Attorney, Agent, or Firm* — Greer Burns & Crain Ltd.

(57) ABSTRACT

There is provided a diamond wafer dividing method used when the diamond wafer having a front surface along the {100} plane is divided at planned dividing lines along the <110> direction. The dividing method includes a first modified layer forming step of forming a first modified layer at a linear first region along the planned dividing line, inside the diamond wafer, a second modified layer forming step of forming a second modified layer at a linear second region shifted from the first region in the width direction and the thickness direction with respect to the front surface, and a dividing step of dividing the diamond wafer along the planned dividing lines by giving a force to the diamond wafer in which the first modified layer and the second modified layer are formed.

8 Claims, 8 Drawing Sheets

DIAMOND WAFER DIVIDING METHOD AND CHIP MANUFACTURING METHOD

BACKGROUND OF THE INVENTION

Field of the Invention

The present invention relates to a diamond wafer dividing method and a chip manufacturing method using the diamond wafer dividing method.

Description of the Related Art

In pieces of electronic equipment typified by mobile phones and personal computers, device chips including devices such as electronic circuits are essential constituent elements. For example, the device chips are obtained by segmenting the front surface side of a wafer composed of a material such as silicon (Si) or silicon carbide (SiC) into a plurality of regions by planned dividing lines referred to as streets, forming the device in each region, and thereafter dividing the wafer along these planned dividing lines.

When the wafer is divided into small pieces such as the device chips, for example, a cutting apparatus in which an annular tool referred to as a cutting blade is mounted on a spindle is used. By rotating the cutting blade at high speed and causing the cutting blade to cut into the wafer along the planned dividing line while a liquid such as pure water is supplied, cutting processing of the wafer can be executed, and the wafer can be divided into a plurality of small pieces (for example, refer to Japanese Patent Laid-open No. Hei 3-198363).

In recent years, diamond, which is excellent in the dielectric strength, the thermal conductivity, and so forth compared with materials such as silicon and silicon carbide, has been attracting attention. For example, when devices are formed by using a diamond wafer composed of single-crystal diamond, it becomes easy to implement the devices having high performance compared with the case of using a wafer composed of a material such as silicon or silicon carbide.

However, since the Mohs hardness of diamond is extremely high, the diamond wafer cannot be necessarily properly divided with the method in which the cutting blade is caused to cut into the wafer like the above-described method. Specifically, for example, the cutting blade is rapidly worn and becomes thin along with the progression of processing, and the size of the small piece cut out from the diamond wafer changes. Further, there is also a problem that the lifetime of the cutting blade becomes extremely short and a huge cost is thus required for the dividing of the diamond wafer.

Thus, studies have been made on a method in which the inside of a diamond wafer is modified by a laser beam along planned dividing lines and then a force is applied to thereby divide the diamond wafer with use of a region that has become brittle due to the modification (hereinafter, referred to as a modified layer) as the start point (for example, refer to Japanese Patent Laid-open No. 2002-192370). In this method, a tool such as a cutting blade for mechanically processing the diamond wafer is not used, and therefore, various problems attributed to wear of the tool also do not occur.

SUMMARY OF THE INVENTION

When a thick wafer is divided by the above-described method in which the modified layer is formed, in general, a plurality of modified layers are overlapped in the thickness direction (depth direction) thereof. However, even when such a plurality of modified layers that overlap in the thickness direction are formed in a diamond wafer, the diamond wafer cannot be necessarily properly divided.

Thus, an object of the present invention is to provide a diamond wafer dividing method by which the diamond wafer can be properly divided compared with related-art methods and a chip manufacturing method using the diamond wafer dividing method.

In accordance with an aspect of the present invention, there is provided a diamond wafer dividing method used when a diamond wafer having a front surface along a {100} plane is divided at planned dividing lines along a <110> direction. The dividing method includes a first modified layer forming step of forming a first modified layer at a linear first region along the planned dividing line, inside the diamond wafer by executing irradiation with a laser beam with such a wavelength as to be transmitted through the diamond wafer, in such a manner that the laser beam is focused on the first region, a second modified layer forming step of forming a second modified layer at a linear second region that is shifted from the first region in a width direction which is parallel to the front surface and which is perpendicular to the first region and in a thickness direction perpendicular to the front surface and that is inside the diamond wafer, by executing irradiation with the laser beam with such a wavelength as to be transmitted through the diamond wafer, in such a manner that the laser beam is focused on the second region, and a dividing step of dividing the diamond wafer along the planned dividing lines by giving a force to the diamond wafer in which the first modified layer and the second modified layer are formed.

Preferably, the diamond wafer dividing method further includes a third modified layer forming step of, before the dividing step, forming a third modified layer at a linear third region that is shifted from the first region in the thickness direction, is shifted from the second region in the width direction and the thickness direction, and is inside the diamond wafer, by executing irradiation with the laser beam with such a wavelength as to be transmitted through the diamond wafer, in such a manner that the laser beam is focused on the third region.

Preferably, a distance in the width direction between the first region and the second region is set to at least 5 μm and at most 50 μm in the second modified layer forming step. Further, preferably, an angle formed by a plane that passes through the first region and the second region and the front surface is set to at least 27° and at most 72° in the second modified layer forming step.

In accordance with another aspect of the present invention, there is provided a chip manufacturing method in which a plurality of chips are manufactured by dividing a diamond wafer by using the above-described diamond wafer dividing method.

In the diamond wafer dividing method according to the aspect of the present invention, when the diamond wafer having the front surface along the {100} plane is divided at the planned dividing lines along the <110> direction, the first modified layer is formed at the linear first region along the planned dividing line, inside the diamond wafer, and the second modified layer is formed at the linear second region that is shifted from the first region in the width direction and the thickness direction and is inside the diamond wafer. Therefore, progression of cleavage on the {111} plane inclined with respect to the front surface is facilitated compared with the case in which a plurality of modified layers are overlapped in the thickness direction of the diamond wafer. Thus, by the diamond wafer dividing method according to the aspect of the present invention, the diamond wafer can be properly divided compared with related-art methods.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
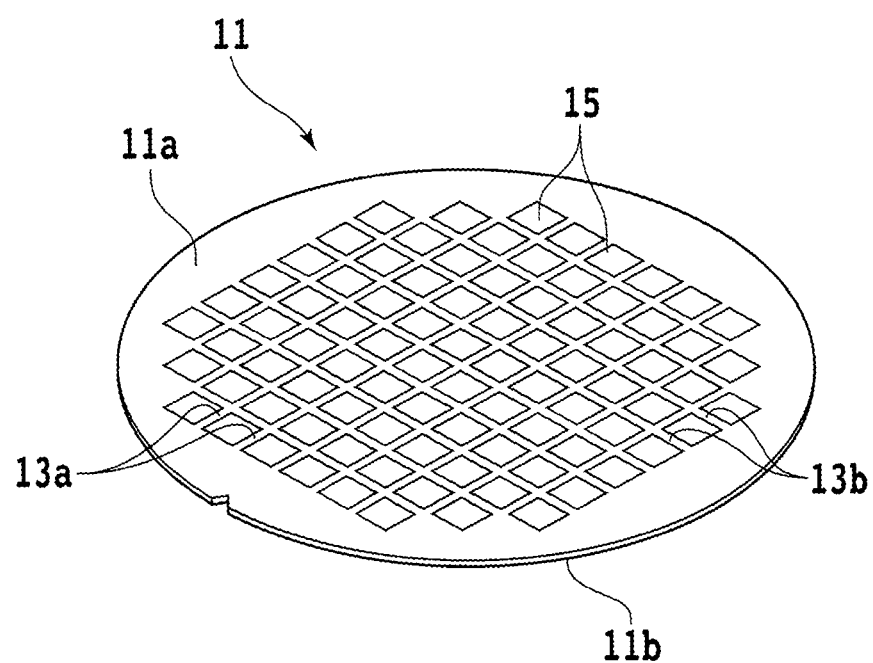
FIG. 1 is a perspective view schematically illustrating a diamond wafer.
Figure 1:
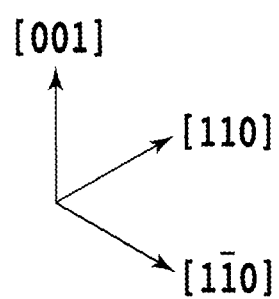
Figure 2:
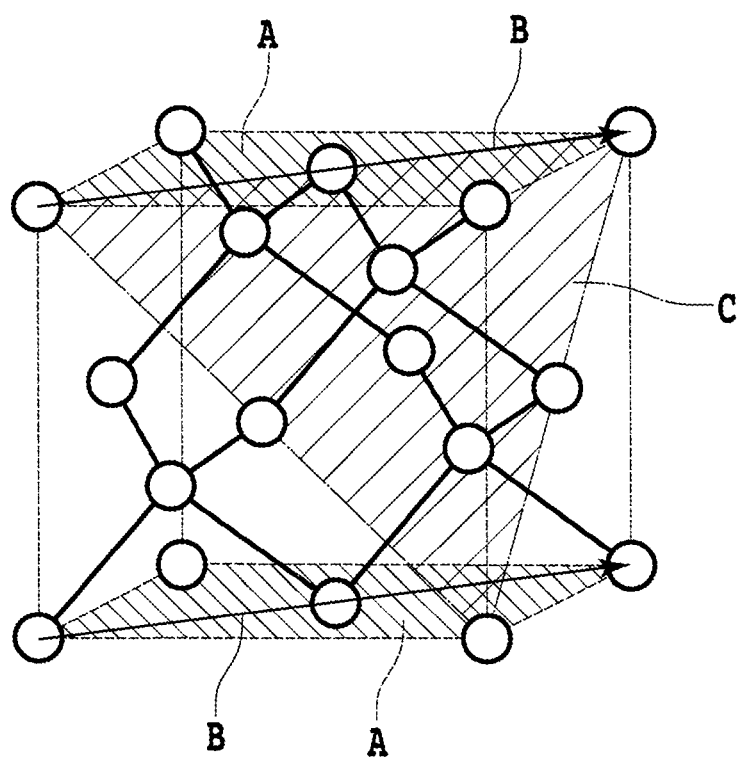
FIG. 2 is a diagram schematically illustrating the structure of a crystal of diamond.
Figure 2:
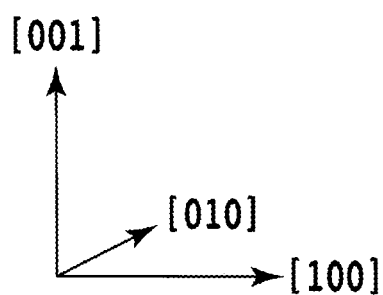

An embodiment of the present invention will be described below with reference to the accompanying drawings. FIG. 1 is a perspective view schematically illustrating a diamond wafer 11 to be divided by a diamond wafer dividing method according to the present embodiment. FIG. 2 is a diagram schematically illustrating the structure of a crystal of diamond. As illustrated in FIG. 1, the diamond wafer 11 is formed into a circular disc shape with substantially single-crystal diamond and has a circular front surface 11a and a circular back surface 11b on the opposite side of the front surface 11a.

The orientation of the crystal of diamond that configures the diamond wafer 11 is adjusted in such a manner that the (001) plane (for example, crystal plane A in FIG. 2) becomes substantially parallel to the front surface 11a and the back surface 11b. However, it suffices that the front surface 11a and the back surface 11b are substantially parallel to a crystal plane equivalent to the (001) plane. That is, the front surface 11a and the back surface 11b are along the {100} plane of the crystal of diamond.

The side of the front surface 11a of the diamond wafer 11 is segmented into a plurality of small regions by a plurality of first planned dividing lines (first streets) 13a that extend along the [110] direction (for example, direction B in FIG. 2) and second planned dividing lines (second streets) 13b that extend in a direction substantially perpendicular to the first planned dividing lines 13a, and a device 15 such as a power device or an integrated circuit (IC) is disposed in each small region.

That is, the direction in which the second planned dividing lines 13b extend is a direction equivalent to the [110] direction, and the first planned dividing lines 13a and the second planned dividing lines 13b both extend along the <110> direction. Further, the first planned dividing lines 13a and the second planned dividing lines 13b both have a predetermined width.

The diamond wafer 11 has a nature that it easily cleaves along a crystal plane equivalent to the (111) plane (for example, crystal plane C in FIG. 2). That is, the diamond wafer 11 easily splits along the {111} plane. In the present embodiment, the front surface 11a is substantially parallel to the (001) plane, and therefore, the diamond wafer 11 easily splits along a plane inclined with respect to the front surface 11a.

Thus, in some cases, it is impossible to properly divide the diamond wafer 11 along a plane that is perpendicular to the front surface 11a of the diamond wafer 11 (i.e. (001) plane) and is parallel to the first planned dividing lines 13a or the second planned dividing lines 13b (i.e. <110> direction) through only overlapping of a plurality of modified layers in the thickness direction of the diamond wafer 11.

Although the diamond wafer 11 that is composed of substantially single-crystal diamond and has a circular disc shape is exemplified in the present embodiment, there is no limitation on the shape, structure, size, and so forth of the diamond wafer 11. Similarly, there is no limitation also on the kind, quantity, shape, structure, size, arrangement, and so forth of the devices 15.

Figure 3:
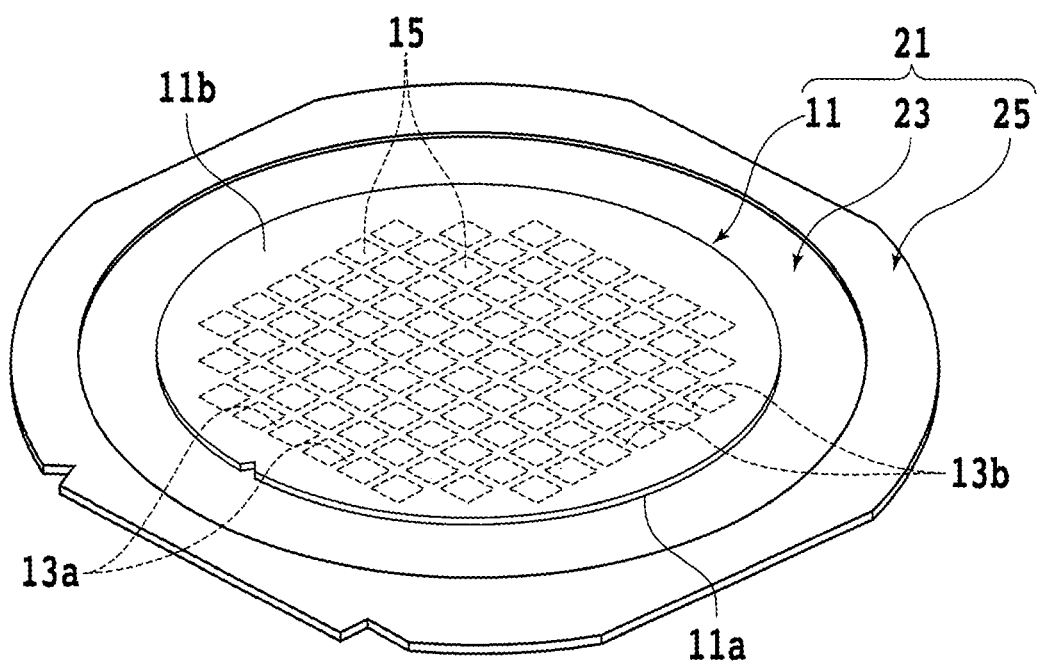
FIG. 3 is a perspective view schematically illustrating a frame unit including the diamond wafer.

When the diamond wafer 11 configured in this manner is divided along the first planned dividing lines 13a and the second planned dividing lines 13b, for example, a frame unit including the diamond wafer 11 is formed (frame unit forming step). FIG. 3 is a perspective view schematically illustrating a frame unit 21 including the diamond wafer 11.

Specifically, a tape 23 with a size that allows covering of the whole of the front surface 11a is stuck to the side of the front surface 11a of the diamond wafer 11. Further, an annular frame 25 that surrounds the diamond wafer 11 is fixed to a peripheral part of the tape 23. This can form the frame unit 21 in which the diamond wafer 11 and the annular frame 25 that surrounds the diamond wafer 11 are integrated through the tape 23. Forming such a frame unit 21 makes handling of the diamond wafer 11 easy.

Figure 4:
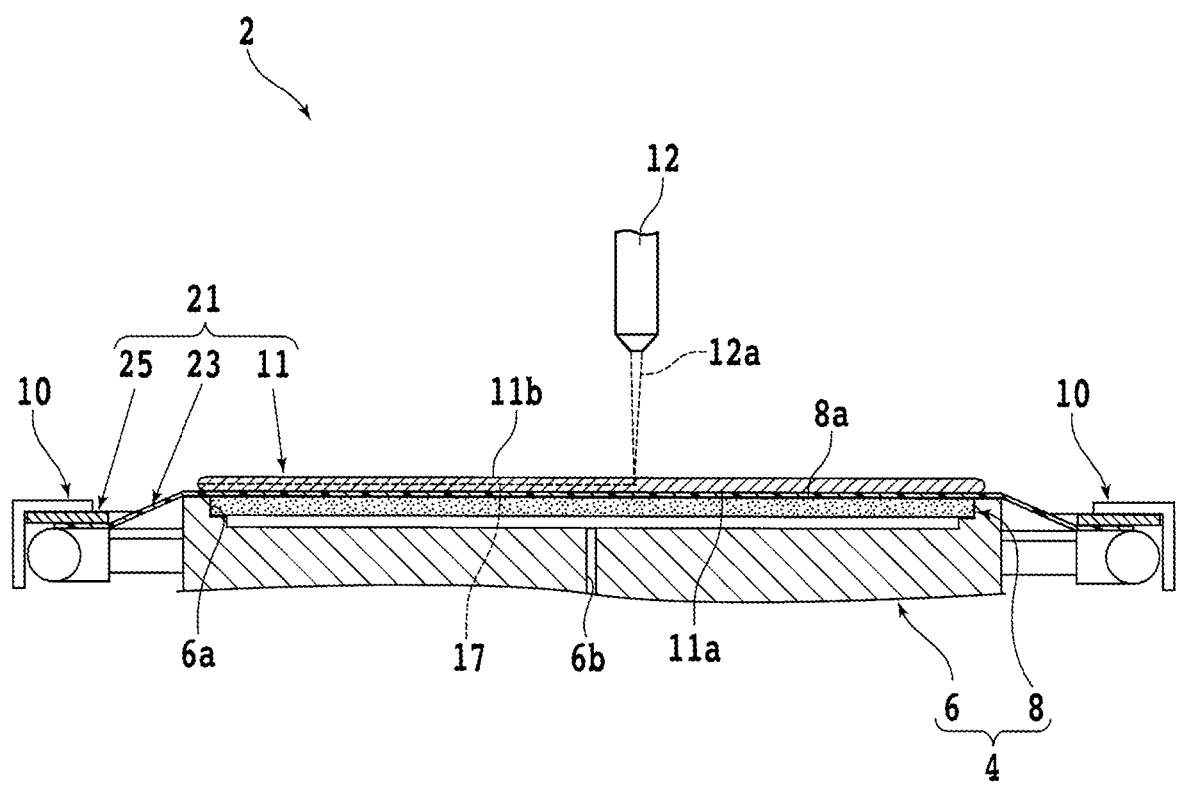
FIG. 4 is a sectional view schematically illustrating how a modified layer is formed inside the diamond wafer.

After the frame unit 21 is formed, a modified layer that becomes the start point when the diamond wafer 11 is divided is formed inside the diamond wafer 11. FIG. 4 is a sectional view schematically illustrating how a modified layer 17 is formed inside the diamond wafer 11. In the present embodiment, for example, a plurality of modified layers 17 are formed inside the diamond wafer 11 by using a laser processing apparatus 2 illustrated in FIG. 4.

The laser processing apparatus 2 includes a chuck table 4 used for holding of the diamond wafer 11. For example, the chuck table 4 includes a frame body 6 that is formed of metal typified by stainless steel and that has a circular disc shape and a holding plate 8 that is formed into a porous circular disc shape with a material such as a ceramic and that is disposed in a recessed part 6a opened in the upper surface of the frame body 6.

The upper surface of the holding plate 8 functions as a holding surface 8a that holds the diamond wafer 11. The recessed part 6a of the frame body 6 is connected to a suction source (not illustrated) such as a vacuum pump through a flow path 6b and so forth made inside the frame body 6. Further, a valve (not illustrated) that can control the flow of fluid is disposed on the flow path 6b and so forth.

Thus, when the valve is opened in the state in which the suction source is operated, a negative pressure generated by this suction source acts on the holding surface 8a of the holding plate 8.

A plurality of clamp mechanisms 10 used for fixing of the frame 25 are disposed around the frame body 6. A rotational drive source (not illustrated) such as a motor is coupled to the lower part of the frame body 6 and, for example, the chuck table 4 can rotate around a rotation axis substantially perpendicular to the above-described holding surface 8a. Moreover, the frame body 6 is supported by a movement mechanism (not illustrated) and, for example, the chuck table 4 can move in a direction substantially parallel to the above-described holding surface 8a (horizontal direction).

A laser irradiation head 12 is disposed over the chuck table 4. The laser irradiation head 12 focuses a laser beam 12a generated by a laser oscillator (not illustrated) on a predetermined position. For example, the laser oscillator includes a laser medium such as neodymium-doped yttrium aluminum garnet (Nd:YAG) and is configured to be capable of generating the pulsed laser beam 12a having such a wavelength as to be transmitted through the diamond wafer 11.

When the modified layers 17 are formed inside the diamond wafer 11, first, the diamond wafer 11 is held by the chuck table 4 of the laser processing apparatus 2 (holding step). Specifically, the frame unit 21 is placed on the chuck table 4 in such a manner that the tape 23 stuck to the side of the front surface 11a of the diamond wafer 11 is brought into contact with the holding surface 8a of the chuck table 4. Thereafter, a negative pressure is caused to act on the holding surface 8a, and the tape 23 is held by the holding surface 8a.

After the tape 23 is sucked by the holding surface 8a, the frame 25 is grasped by the clamp mechanisms 10 disposed around the chuck table 4. The grasping of the frame 25 by the clamp mechanisms 10 may be executed simultaneously with the bringing the tape 23 into contact with the holding surface 8a or before the tape 23 is brought into contact with the holding surface 8a. This causes the diamond wafer 11 to be held by the chuck table 4 with the side of the back surface 11b exposed upward.

Figure 5:
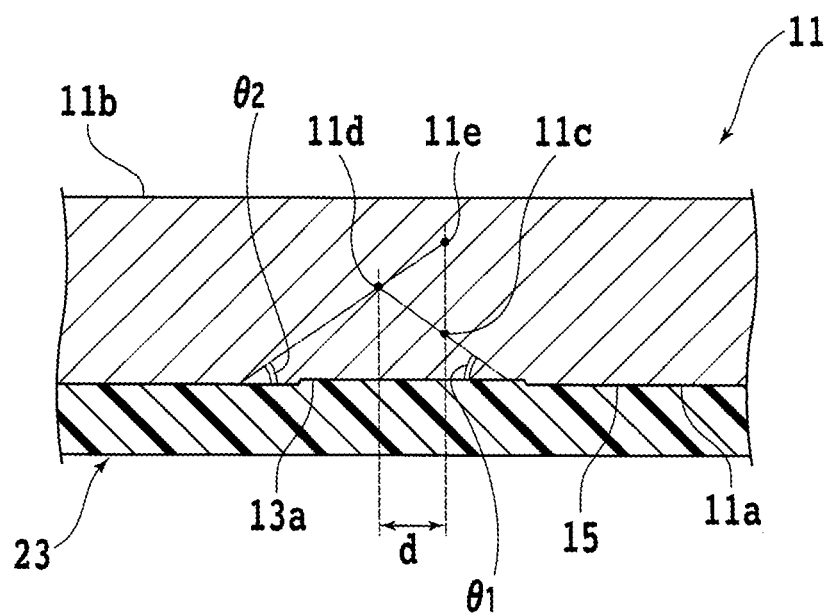
FIG. 5 is a sectional view schematically illustrating regions on which a laser beam is focused inside the diamond wafer.

After the diamond wafer 11 is held by the chuck table 4, irradiation with the laser beam 12a with such a wavelength as to be transmitted through the diamond wafer 11 is executed in such a manner that the laser beam 12a is focused on each of a plurality of regions inside the diamond wafer 11, and the plurality of modified layers 17 are formed. FIG. 5 is a sectional view schematically illustrating the plurality of regions on which the laser beam 12a is focused inside the diamond wafer 11. In FIG. 5, a section perpendicular to the first planned dividing line 13a is illustrated.

As illustrated in FIG. 5, in the present embodiment, three regions for focusing of the laser beam 12a thereon are set on each first planned dividing line 13a. A first region 11c is a linear region located at a predetermined distance from the front surface 11a of the diamond wafer 11 and is set along the length direction of the first planned dividing line 13a of the target.

A second region 11d is a linear region shifted from the first region 11c in the width direction that is parallel to the front surface 11a and that is perpendicular to the first region 11c (width direction of the first planned dividing line 13a) and in the thickness direction perpendicular to the front surface 11a (thickness direction of the diamond wafer 11). The second region 11d is also set along the length direction of the first planned dividing line 13a of the target.

A third region 11e is a linear region that is shifted from the first region 11c in the thickness direction and that is shifted from the second region 11d in the width direction and the thickness direction. However, the third region 11e may be shifted from the first region 11c in the width direction. That is, the third region 11e does not need to be shifted from the first region 11c only in the thickness direction.

The third region 11e is also set along the length direction of the first planned dividing line 13a of the target. That is, the first region 11c, the second region 11d, and the third region 11e are substantially parallel to each other. Further, the lengths of the first region 11c, the second region 11d, and the third region 11e are all equivalent to the length of the first planned dividing line 13a of the target.

A distance d (distance of shift, interval) in the width direction between the first region 11c and the second region 11d is set to preferably at least 5 μm and at most 50 μm and typically 28 μm. Further, an angle θ1 formed by a plane that passes through the first region 11c and the second region 11d and the front surface 11a (or the back surface 11b) is set to preferably at least 27° and at most 72° and typically 54° to 55°.

The relation between the second region 11d and the third region 11e is also the same. That is, the distance d (distance of shift, interval) in the width direction between the second region 11d and the third region 11e is set to preferably at least 5 μm and at most 50 μm and typically 28 μm. Further, an angle θ2 formed by a plane that passes through the second region 11d and the third region 11e and the front surface 11a (or the back surface 11b) is set to preferably at least 27° and at most 72° and typically 54° to 55°.

Setting the first region 11c, the second region 11d, and the third region 11e that satisfy such conditions facilitates progression of cracks along the {111} plane between the modified layer 17 formed at the first region 11c and the modified layer 17 formed at the second region 11d and between the modified layer 17 formed at the second region 11d and the modified layer 17 formed at the third region 11e, for example. As a result, it becomes possible to properly divide the diamond wafer 11 along the first planned dividing line 13a of the target.

An example of the procedure when the plurality of modified layers 17 are formed along the first planned dividing line 13a of the diamond wafer 11 will be described. First, irradiation with the laser beam 12a is executed with the laser beam 12a focused on the above-described first region 11c, and the modified layer 17 is formed at the first region 11c (first modified layer forming step).

Specifically, for example, the angle of the chuck table 4 around the rotation axis is adjusted to cause the first planned dividing line 13a of the target to become substantially parallel to the direction of the movement of the chuck table 4. Then, the chuck table 4 is moved to adjust the position of the laser irradiation head 12 to a position above an extension line of the first region 11c of the target.

Thereafter, as illustrated in FIG. 4, the chuck table 4 is moved in a direction substantially parallel to the first planned dividing line 13a while irradiation with the laser beam 12a from the laser irradiation head 12 is executed. Here, the position of the focal point on which the laser beam 12a is focused is adjusted to overlap with the above-described first region 11c.

Although there is no particular limitation on the other conditions, it is preferable to set the power of the laser beam 12a to, for example, 0.2 to 2 W, typically 0.8 W, and set the repetition frequency of the laser beam 12a to, for example, 20 to 200 KHz, typically 50 KHz, and set the speed of the movement of the chuck table 4 to, for example, 100 to 800 mm/s, typically 400 mm/s.

Figure 6:
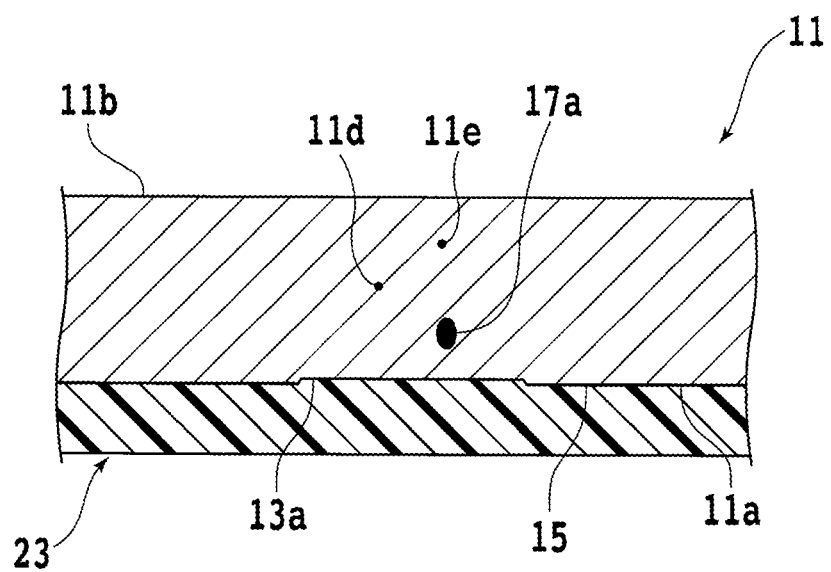
FIG. 6 is a sectional view schematically illustrating the state in which a first modified layer has been formed in the diamond wafer.

This causes multi-photon absorption in the vicinity of the focal point of the laser beam 12a and can form the modified layer 17 in the linear first region 11c inside the diamond wafer 11. FIG. 6 is a sectional view schematically illustrating a first modified layer 17a formed in the diamond wafer 11. Also in FIG. 6, a section perpendicular to the first planned dividing line 13a is illustrated.

After the first modified layer 17a is formed at the first region 11c, the modified layer 17 is formed at the second region 11d by a similar procedure (second modified layer forming step). Specifically, the chuck table 4 is moved to adjust the position of the laser irradiation head 12 to a position above an extension line of the second region 11d of the target.

Thereafter, the chuck table 4 is moved in a direction substantially parallel to the first planned dividing line 13a while irradiation with the laser beam 12a from the laser irradiation head 12 is executed. The position of the focal point on which the laser beam 12a is focused is adjusted to overlap with the above-described second region 11d. The other conditions may be similar to those in the case of forming the first modified layer 17a, for example.

Figure 7:
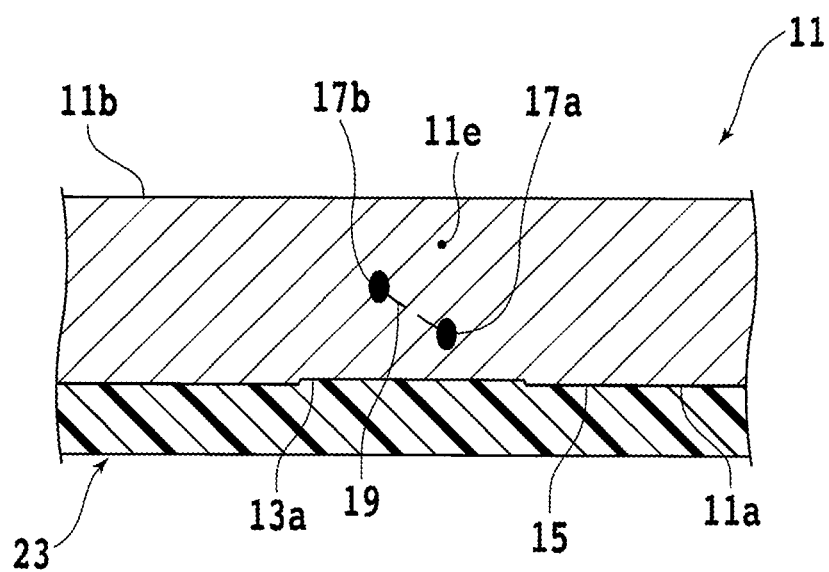
FIG. 7 is a sectional view schematically illustrating the state in which a second modified layer has been formed in the diamond wafer.

This causes multi-photon absorption in the vicinity of the focal point of the laser beam 12a and can form the modified layer 17 in the linear second region 11d inside the diamond wafer 11. FIG. 7 is a sectional view schematically illustrating a second modified layer 17b formed in the diamond wafer 11. Also in FIG. 7, a section perpendicular to the first planned dividing line 13a is illustrated.

When the first modified layer 17a and the second modified layer 17b are formed to satisfy the above-described positional relation, for example, progression of a crack 19 along the {111} plane like one illustrated in FIG. 7 is facilitated between the first modified layer 17a and the second modified layer 17b due to a stress that acts from both the first modified layer 17a and the second modified layer 17b. This makes it possible to properly divide the diamond wafer 11 along the first planned dividing line 13a of the target.

After the second modified layer 17b is formed at the second region 11d, the modified layer 17 is formed at the third region 11e by a similar procedure (third modified layer forming step). Specifically, the chuck table 4 is moved to adjust the position of the laser irradiation head 12 to a position above an extension line of the third region 11e of the target.

Thereafter, the chuck table 4 is moved in a direction substantially parallel to the first planned dividing line 13a while irradiation with the laser beam 12a from the laser irradiation head 12 is executed. The position of the focal point on which the laser beam 12a is focused is adjusted to overlap with the above-described third region 11e. The other conditions may be similar to those in the case of forming the first modified layer 17a, for example.

Figure 8:
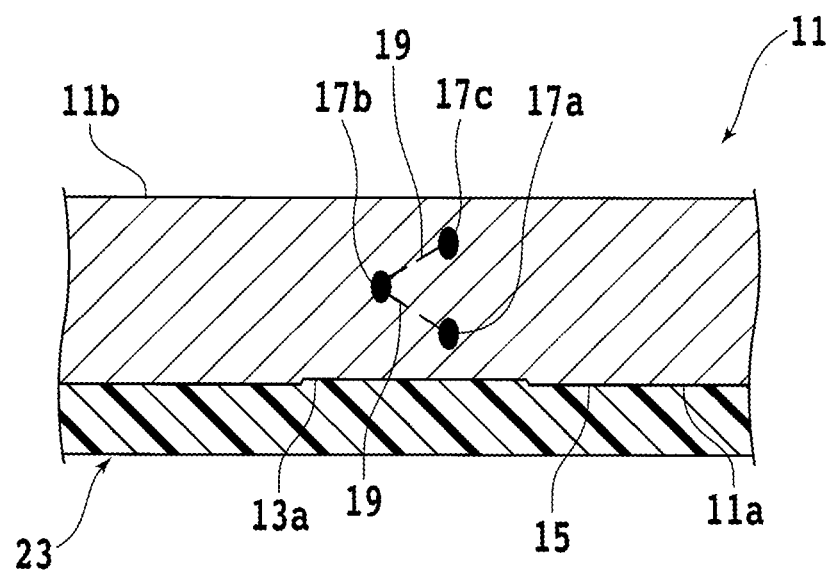
FIG. 8 is a sectional view schematically illustrating the state in which a third modified layer has been formed in the diamond wafer.

This causes multi-photon absorption in the vicinity of the focal point of the laser beam 12a and can form the modified layer 17 in the linear third region 11e inside the diamond wafer 11. FIG. 8 is a sectional view schematically illustrating a third modified layer 17c formed in the diamond wafer 11. Also in FIG. 8, a section perpendicular to the first planned dividing line 13a is illustrated.

When the second modified layer 17b and the third modified layer 17c are formed to satisfy the above-described positional relation, for example, progression of the crack 19 along the {111} plane like one illustrated in FIG. 8 is facilitated between the second modified layer 17b and the third modified layer 17c due to a stress that acts from both the second modified layer 17b and the third modified layer 17c. This makes it possible to properly divide the diamond wafer 11 along the first planned dividing line 13a of the target.

Although, here, the procedure in the case of forming the first modified layer 17a, the second modified layer 17b, and the third modified layer 17c has been described with focus on the first planned dividing line 13a of the target, the first modified layer 17a, the second modified layer 17b, and the third modified layer 17c are formed by the same procedure also for the other first planned dividing lines 13a and the second planned dividing lines 13b.

However, there is no particular limitation on the order of forming the first modified layer 17a, the second modified layer 17b, and the third modified layer 17c. For example, it is also possible to form the first modified layer 17a along all first planned dividing lines 13a and second planned dividing lines 13b, then form the second modified layer 17b along all first planned dividing lines 13a and second planned dividing lines 13b, and thereafter form the third modified layer 17c along all first planned dividing lines 13a and second planned dividing lines 13b.

That is, the present invention is not limited to the form in which the first modified layer 17a, the second modified layer 17b, and the third modified layer 17c are formed along one first planned dividing line 13a or second planned dividing line 13b and thereafter the first modified layer 17a, the second modified layer 17b, and the third modified layer 17c are formed along another first planned dividing line 13a or second planned dividing line 13b.

After the first modified layer 17a, the second modified layer 17b, and the third modified layer 17c are formed along each of all first planned dividing lines 13a and second planned dividing lines 13b of the diamond wafer 11, a force is given to the diamond wafer 11 to divide the diamond wafer 11 into a plurality of chips along the first planned dividing lines 13a and the second planned dividing lines 13b (dividing step).

In the present embodiment, the first modified layer 17a, the second modified layer 17b, and the third modified layer 17c are formed to satisfy the above-described positional relation. Thus, by giving an appropriate force to the diamond wafer 11, the diamond wafer 11 can be divided along the first planned dividing lines 13a and the second planned dividing lines 13b and a plurality of chips can be formed.

There is no particular limitation on the method for giving a force to the diamond wafer 11. For example, a force can be given by using a method in which the tape 23 is expanded, a method in which a blade-shaped member is pressed against the diamond wafer 11, or the like.

As described above, in the diamond wafer dividing method according to the present embodiment, when the diamond wafer 11 having the front surface 11a along the {100} plane is divided at the first planned dividing lines 13a and the second planned dividing lines 13b along the <110> direction, the first modified layer 17a is formed at the linear first region 11c inside the diamond wafer 11 and the second modified layer 17b is formed at the linear second region 11d that is shifted from the first region 11c in the width direction and the thickness direction and that is inside the diamond wafer 11. Therefore, progression of cleavage on the {111} plane inclined with respect to the front surface 11a is facilitated compared with the case in which a plurality of modified layers are overlapped in the thickness direction of the diamond wafer 11.

Thus, by the diamond wafer dividing method according to the present embodiment, the diamond wafer 11 can be properly divided compared with related-art methods. Moreover, by using the diamond wafer dividing method according to the present embodiment for a chip manufacturing method, the diamond wafer 11 can be properly divided, and a plurality of chips having high quality can be manufactured.

The present invention is not limited to the description of the above embodiment and can be carried out with various changes. For example, in the above-described embodiment, three layers of the modified layer 17 (the first modified layer 17a, the second modified layer 17b, and the third modified layer 17c) along each first planned dividing line 13a and each second planned dividing line 13b are formed. However, the present invention can be applied to the case in which two or more layers of the modified layer are formed along each planned dividing line.

In particular, in the case of forming four or more layers of the modified layer, it is preferable that the positional relation between the (2n−1)-th layer and the 2n-th layer (n is an integer equal to or larger than 2) be made to match the positional relation between the first layer (first modified layer 17a) and the second layer (second modified layer 17b). Further, it is preferable that the positional relation between the 2n-th layer and the (2n +1)-th layer be made to match the positional relation between the second layer (second modified layer 17b) and the third layer (third modified layer 17c).

Besides, structures, methods, and so forth according to the above-described embodiment and modification example can be carried out with appropriate changes without departing from the range of the object of the present invention.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A diamond wafer dividing method used when a diamond wafer having a front surface along a {100} plane is divided at planned dividing lines along a <110> direction, the dividing method comprising:
    a first modified layer forming step of forming a first modified layer at a linear first region along the planned dividing line, inside the diamond wafer by executing irradiation with a laser beam with such a wavelength as to be transmitted through the diamond wafer, in such a manner that the laser beam is focused on the first region;
    a second modified layer forming step of forming a second modified layer at a linear second region that is shifted from the first region in a width direction which is parallel to the front surface and which is perpendicular to the first region and in a thickness direction perpendicular to the front surface and that is inside the diamond wafer, by executing irradiation with the laser beam with such a wavelength as to be transmitted through the diamond wafer, in such a manner that the laser beam is focused on the second region; and
    a dividing step of dividing the diamond wafer along the planned dividing lines by giving a force to the diamond wafer in which the first modified layer and the second modified layer are formed.

2. The diamond wafer dividing method according to claim 1, further comprising:
    a third modified layer forming step of, before the dividing step, forming a third modified layer at a linear third region that is shifted from the first region in the thickness direction, is shifted from the second region in the width direction and the thickness direction, and is inside the diamond wafer, by executing irradiation with the laser beam with such a wavelength as to be transmitted through the diamond wafer, in such a manner that the laser beam is focused on the third region.

3. The diamond wafer dividing method according to claim 1, wherein
    a distance in the width direction between the first region and the second region is set to at least 5 μm and at most 50 μm in the second modified layer forming step.

4. The diamond wafer dividing method according to claim 1, wherein
    an angle formed by a plane that passes through the first region and the second region and the front surface is set to at least 27° and at most 72° in the second modified layer forming step.

5. A chip manufacturing method in which a plurality of chips are manufactured by dividing a diamond wafer having a front surface along a {100} plane at planned dividing lines along a <110> direction, the manufacturing method comprising:
    a first modified layer forming step of forming a first modified layer at a linear first region along the planned dividing line, inside the diamond wafer by executing irradiation with a laser beam with such a wavelength as to be transmitted through the diamond wafer, in such a manner that the laser beam is focused on the first region;
    a second modified layer forming step of forming a second modified layer at a linear second region that is shifted from the first region in a width direction which is parallel to the front surface and which is perpendicular to the first region and in a thickness direction perpendicular to the front surface and that is inside the diamond wafer, by executing irradiation with the laser beam with such a wavelength as to be transmitted through the diamond wafer, in such a manner that the laser beam is focused on the second region; and
    a dividing step of dividing the diamond wafer along the planned dividing lines to manufacture the plurality of chips by giving a force to the diamond wafer in which the first modified layer and the second modified layer are formed.

6. The chip manufacturing method according to claim 5, further comprising:
    a third modified layer forming step of, before the dividing step, forming a third modified layer at a linear third region that is shifted from the first region in the thickness direction, is shifted from the second region in the width direction and the thickness direction, and is inside the diamond wafer, by executing irradiation with the laser beam with such a wavelength as to be transmitted through the diamond wafer, in such a manner that the laser beam is focused on the third region.

7. The chip manufacturing method according to claim 5, wherein
    a distance in the width direction between the first region and the second region is set to at least 5 pm and at most 50 μm in the second modified layer forming step.

8. The chip manufacturing method according to claim 5, wherein an angle formed by a plane that passes through the first region and the second region and the front surface is set to at least 27° and at most 72° in the second modified layer forming step.

* * * * *